US012563763B2

(12) United States Patent
Shi

(10) Patent No.: US 12,563,763 B2
(45) Date of Patent: Feb. 24, 2026

(54) MANUFACTURING METHODS OF DISPLAY PANELS AND DISPLAY PANELS

(71) Applicant: TCL CHINA STAR OPTOELECTRONICS TECHNOLOGY CO., LTD., Shenzhen (CN)

(72) Inventor: Jiaojiao Shi, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 357 days.

(21) Appl. No.: 18/220,923

(22) Filed: Jul. 12, 2023

(65) Prior Publication Data

US 2024/0332307 A1　　Oct. 3, 2024

(30) Foreign Application Priority Data

Mar. 30, 2023　(CN) .......................... 202310375386.3

(51) Int. Cl.
*H10D 30/01*　　(2025.01)
*H10D 30/67*　　(2025.01)
*H10D 86/01*　　(2025.01)

(52) U.S. Cl.
CPC ..... *H10D 30/0316* (2025.01); *H10D 30/0321* (2025.01); *H10D 30/6732* (2025.01); *H10D 30/6746* (2025.01); *H10D 86/0221* (2025.01)

(58) Field of Classification Search
CPC ........... H10D 30/0316; H10D 30/0321; H10D 86/0221
See application file for complete search history.

(56) References Cited

U.S. PATENT DOCUMENTS

2011/0269274 A1* 11/2011 Furuta ................ H10D 30/0316
438/158

* cited by examiner

*Primary Examiner* — Peter M Albrecht
(74) *Attorney, Agent, or Firm* — The Roy Gross Law Firm, LLC; Roy D. Gross

(57) ABSTRACT

A manufacturing method of a display panel includes following steps: forming a semiconductor layer on a substrate, in which the semiconductor layer includes a semiconductor sub-layer and an ohmic contact layer including a first sub-ohmic contact layer and a second sub-ohmic contact layer, and a volume flow rate of phosphine for forming the first sub-ohmic contact layer is greater than or equal to 6590 sccm and less than or equal to 12590 sccm, and a volume flow rate of phosphine for forming the second sub-ohmic contact layer is greater than or equal to 21000 sccm and less than or equal to 27000 sccm.

13 Claims, 3 Drawing Sheets

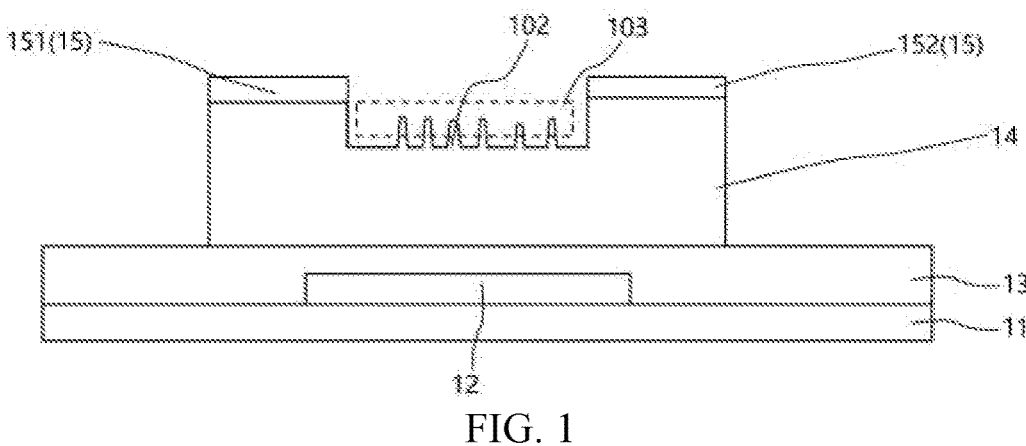

FIG. 1

Step S100

Providing a substrate

Forming a semiconductor layer on the substrate, where the step of forming the semiconductor layer on the substrate may include: forming a semiconductor sub-layer on the substrate, forming a first sub-ohmic contact layer on the semiconductor sub-layer, and forming a second sub-ohmic contact layer on the first sub-ohmic contact layer; a volume flow rate of phosphine for forming the first sub-ohmic contact layer may be greater than or equal to 6590 sccm and less than or equal to 12590 sccm, and a volume flow rate of phosphine for forming the second sub-ohmic contact layer may be greater than or equal to 21000 sccm and less than or equal to 27000 sccm; and the first sub-ohmic contact layer and the second sub-ohmic contact layer may form an ohmic contact layer with a thickness greater than or equal to 40 Å and less than or equal to 100 Å

Step S200

Step S300

Forming a source drain metal layer on the semiconductor layer

Etching the source drain metal layer to form a source and a drain, and etching the semiconductor layer to remove a part of the ohmic contact layer disposed between the source and the drain Step S400

FIG. 2

MANUFACTURING METHODS OF DISPLAY PANELS AND DISPLAY PANELS

CROSS-REFERENCE TO RELATED DISCLOSURE

This disclosure claims priority to and the benefit of Chinese Patent Disclosure No. 202310375386.3, filed on Mar. 30, 2023, the disclosure of which is incorporated herein by reference in its entirety.

TECHNICAL FIELD

The present disclosure relates to display technologies, and in particular, to manufacturing methods of display panels and display panels.

BACKGROUND

With development of display technologies, display panels have been widely used in display screens, such as a mobile phone, a computer, a television, and the like. Gradually, users have higher demands for display performances and the resolution of the display panels. In thin film transistors of the display panels, since a source/drain metal layer may be directly lap-jointed on a semiconductor layer, a part of the semiconductor layer between a source and a drain may also be etched when etching the source/drain metal layer to form the source and the drain.

Referring to FIG. 1, the inventor found that a surface of the semiconductor layer may form several abnormal protrusions 102 after the part of the semiconductor layer between the source and the drain was etched, reducing stability of the thin film transistors, and thus reducing the uniformity of the display panels.

SUMMARY

Embodiments of the present disclosure provide a manufacturing method of a display panel, which may include following steps:

providing a substrate;

forming a semiconductor layer on the substrate, where the step of forming the semiconductor layer on the substrate may include: forming a semiconductor sub-layer on the substrate, forming a first sub-ohmic contact layer on the semiconductor sub-layer, and forming a second sub-ohmic contact layer on the first sub-ohmic contact layer; a volume flow rate of phosphine for forming the first sub-ohmic contact layer may be greater than or equal to 6590 sccm and less than or equal to 12590 sccm, and a volume flow rate of phosphine for forming the second sub-ohmic contact layer may be greater than or equal to 21000 sccm and less than or equal to 27000 sccm; and the first sub-ohmic contact layer and the second sub-ohmic contact layer may form an ohmic contact layer with a thickness greater than or equal to 40 Å and less than or equal to 100 Å;

forming a source/drain metal layer on the semiconductor layer;

etching the source/drain metal layer to form a source and a drain, and etching the semiconductor layer to remove a part of the ohmic contact layer disposed between the source and the drain.

Optionally, in some embodiments of the present disclosure, a thickness of the first sub-ohmic contact layer may be greater than a thickness of the second sub-ohmic contact layer.

Optionally, in some embodiments of the present disclosure, a doping concentration of the first sub-ohmic contact layer may be less than a doping concentration of the second sub-ohmic contact layer.

Optionally, in some embodiments of the present disclosure, a volume flow rate of chlorine in an etching gas for etching the semiconductor layer may be less than 400 sccm.

Optionally, in some embodiments of the present disclosure, materials of the source/drain metal layer may include copper.

Optionally, in some embodiments of the present disclosure, a thickness of the semiconductor layer may be greater than or equal to 640 Å and less than or equal to 1100 Å.

Optionally, in some embodiments of the present disclosure, the part of the ohmic contact layer disposed between the source and the drain may be at least partially disconnected.

Optionally, in some embodiments of the present disclosure, the part of the ohmic contact layer disposed between the source and the drain may form an opening exposing the semiconductor sub-layer.

Optionally, in some embodiments of the present disclosure, the opening may pass through a part of the first sub-ohmic contact layer and a part of the second sub-ohmic contact layer disposed between the source and the drain, and a width of the opening may be equal to a distance between the source and the drain.

Optionally, in some embodiments of the present disclosure, a doping concentration of phosphine in the first sub-ohmic contact layer may be less than a doping concentration of phosphine in the second sub-ohmic contact layer; and a volume flow rate of chlorine in an etching gas for etching the semiconductor layer may be less than 400 sccm.

Optionally, in some embodiments of the present disclosure, an etching gas for etching the semiconductor layer may include chlorine and sulfur hexafluoride ($SF_6$), and a volume flow rate of the chlorine may be less than 400 sccm.

Embodiments of the present disclosure further provide a manufacturing method of a display panel, which may include following steps:

providing a substrate;

forming a semiconductor layer on the substrate, where the step of forming the semiconductor layer on the substrate may include: forming a semiconductor sub-layer on the substrate, forming a first sub-ohmic contact layer on the semiconductor sub-layer, and forming a second sub-ohmic contact layer on the first sub-ohmic contact layer; a volume flow rate of phosphine for forming the first sub-ohmic contact layer may be greater than or equal to 6590 sccm and less than or equal to 12590 sccm, and a volume flow rate of phosphine for forming the second sub-ohmic contact layer may be greater than or equal to 21000 sccm and less than or equal to 27000 sccm; and the first sub-ohmic contact layer and the second sub-ohmic contact layer may form an ohmic contact layer with a thickness greater than or equal to 40 Å and less than or equal to 100 Å;

forming a source/drain metal layer on the semiconductor layer;

etching the source/drain metal layer to form a source and a drain, and etching the semiconductor layer to remove a part of the ohmic contact layer disposed between the source and the drain, where a volume flow rate of chlorine in an etching gas for etching the semiconductor layer may be less than 400 sccm.

Optionally, in some embodiments of the present disclosure, the etching gas for etching the semiconductor layer further may include sulfur hexafluoride ($SF_6$).

Accordingly, embodiments of the present disclosure further provide a display panel, which may include:

a substrate; and a semiconductor layer disposed on the substrate, where the semiconductor layer may include a semiconductor sub-layer and an ohmic contact layer disposed on the semiconductor sub-layer, and a thickness of the ohmic contact layer may be greater than or equal to 40 Å and less than or equal to 100 Å;

where the ohmic contact layer may include a first sub-ohmic contact layer disposed on the semiconductor sub-layer and a second sub-ohmic contact layer disposed on the first sub-ohmic contact layer, and a doping concentration of the first sub-ohmic contact layer may be less than a doping concentration of the second sub-ohmic contact layer.

Optionally, in some embodiments of the present disclosure, a thickness of the first sub-ohmic contact layer may be greater than a thickness of the second sub-ohmic contact layer.

Optionally, in some embodiments of the present disclosure, the display panel may further include:

a gate disposed between the substrate and the semiconductor layer;

a gate insulation layer disposed on a surface of the gate away from the substrate, where the semiconductor layer may be disposed on a surface of the gate insulation layer away from the gate; and a source and a drain disposed on a surface of the ohmic contact layer away from the gate insulation layer at intervals, where a part of the ohmic contact layer disposed between the source and the drain may be at least partially disconnected.

Optionally, in some embodiments of the present disclosure, both of materials of the source and materials of the drain may include copper.

Optionally, in some embodiments of the present disclosure, the part of the ohmic contact layer disposed between the source and the drain may be provided with an opening exposing the semiconductor sub-layer.

Optionally, in some embodiments of the present disclosure, the part of the ohmic contact layer disposed between the source and the drain may be provided with an opening exposing the semiconductor sub-layer; and the opening may pass through a part of the first sub-ohmic contact layer and a part of the second sub-ohmic contact layer disposed between the source and the drain, and a width of the opening may be equal to a distance between the source and the drain.

Optionally, in some embodiments of the present disclosure, a thickness of the semiconductor layer may be greater than or equal to 640 Å and less than or equal to 1100 Å; and a doping concentration of phosphine in the first sub-ohmic contact layer may be less than a doping concentration of phosphine in the second sub-ohmic contact layer.

BRIEF DESCRIPTION OF THE DRAWINGS

FIG. 1 is a schematic structural diagram of a thin film transistor in the existing art.

FIG. 2 is a flowchart of a manufacturing method of a display panel according to an embodiment of the present disclosure.

DETAILED DESCRIPTION

Figure 3:
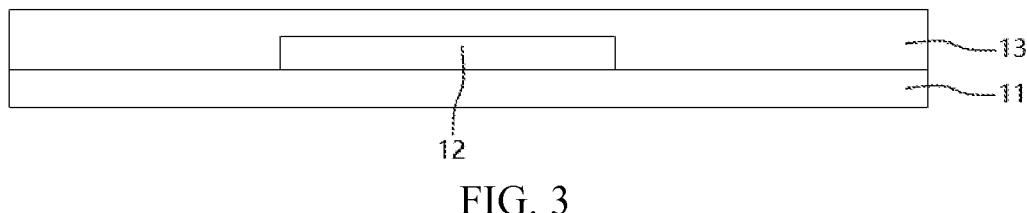
FIG. 3 is a schematic diagram of a first intermediate process of the manufacturing method of the display panel according to the embodiment of the present disclosure.

In combination with drawings in the embodiments of the present disclosure, technical solutions in the embodiments of the present disclosure will be described clearly and completely. Obviously, the described embodiments are only part of the embodiments of the present disclosure, not all of them. Based on the embodiments of the present disclosure, all other embodiments obtained by those skilled in the art without creative effort belong to a scope of the present disclosure. In addition, it should be understood that specific embodiments described herein are only used to explain and interpret the present disclosure and are not used to limit the present disclosure. In the present disclosure, location terms used, such as "up" and "down", generally refer to up and down in actual using or working state of devices, in particular drawing directions in the drawings, unless otherwise described; terms "inside" and "outside" refer to outlines of the devices.

Referring to FIG. 1, and FIG. 1 is a schematic structural diagram of a thin film transistor in the existing art. The thin film transistor illustrated in FIG. 1 includes a substrate 11, a gate 12 disposed on the substrate 11, a gate insulation layer 13 disposed on the gate 12, a semiconductor layer 14 disposed on the gate insulation layer 13, and a source 151 and a drain 152 disposed on the semiconductor layer 14. In a manufacturing process of the thin film transistor, the inventor found that when etching a source/drain metal layer 15 formed on the semiconductor layer 14 to form the source 151 and the drain 152, a part of the semiconductor layer 14 may be etched off. As shown in FIG. 1, a part 103 in the dashed box illustrates a part of the etched semiconductor layer, and a surface of the semiconductor layer 14 forms a plurality of abnormal protrusions 102, which reduces performances of the thin film transistor, and leads to decrease of the uniformity of a display panel including the thin film transistor due to an uneven distribution of the abnormal protrusions 102. For example, uneven charging of the thin film transistor in various parts of the display panel may lead to uneven brightness of the display panel. Moreover, the uneven distribution of the abnormal protrusions 102 may cause the insulation layers covering the semiconductor layer 14 to crack, thereby reducing the stability of the display panel. Furthermore, the inventor found that materials of the abnormal protrusions 102 include chloride, for example, when materials of the source/drain metal layer 15 include copper, the chloride may be copper chloride ($CuCl_2$). The inventor further found that the reasons of forming the abnormal protrusion 102 are as follows: with improvement of the resolution of the display panel, a size of the thin film transistor gets smaller, since the source/drain metal layer 15 is thicker, less acid can be immersed in a channel between the source 151 and the drain 152, resulting in less residue of copper after etching the source/drain metal layer 15 by a wet etching process. A dry etching process may be performed on the source/drain metal layer 15 after etching the source/drain metal layer 15 by the wet etching process, and n+ a-Si and a-Si in materials of the channel are mainly etched in the dry etching process. Etching gas used in the dry etching process includes chlorine ($Cl_2$), since $Cl_2$ may corrode the residual copper to form other non-volatile solid substances that cannot be removed, the dry etching process performed on the semiconductor layer 104 may be affected, resulting in the formation of the columnar abnormal protrusions 102.

Embodiments of the present disclosure provide a manufacturing method of a display panel to solve the above-mentioned technical problem(s). The manufacturing method of the display panel includes following steps: step S100, providing a substrate; step S200, forming a semiconductor layer on the substrate; the step S200 include following steps: forming a semiconductor sub-layer on the substrate, forming a first sub-ohmic contact layer on the semiconductor sub-layer, and forming a second sub-ohmic contact layer on the first sub-ohmic contact layer; a volume flow rate of phosphine for forming the first sub-ohmic contact layer is greater than or equal to 6590 sccm and less than or equal to 12590 sccm, and a volume flow rate of phosphine for forming the second sub-ohmic contact layer is greater than or equal to 21000 sccm and less than or equal to 27000 sccm; and the first sub-ohmic contact layer and the second sub-ohmic contact layer form an ohmic contact layer with a thickness greater than or equal to 40 Å and less than or equal to 100 Å; step S300, forming a source/drain metal layer on the semiconductor layer; and step S400, etching the source/drain metal layer, and etching the semiconductor layer to remove a part of the ohmic contact layer disposed between the source and the drain.

Detailed illustrations will be described below. It should be noted that a description order of the following embodiments does not serve as a limitation to a preferred order of the embodiments.

Figure 4:
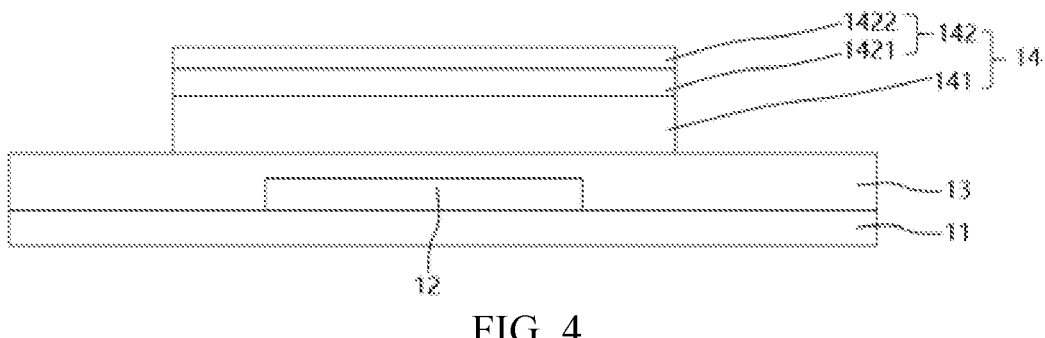
FIG. 4 is a schematic diagram of a second intermediate process of the manufacturing method of the display panel according to the embodiment of the present disclosure.
Figure 5:
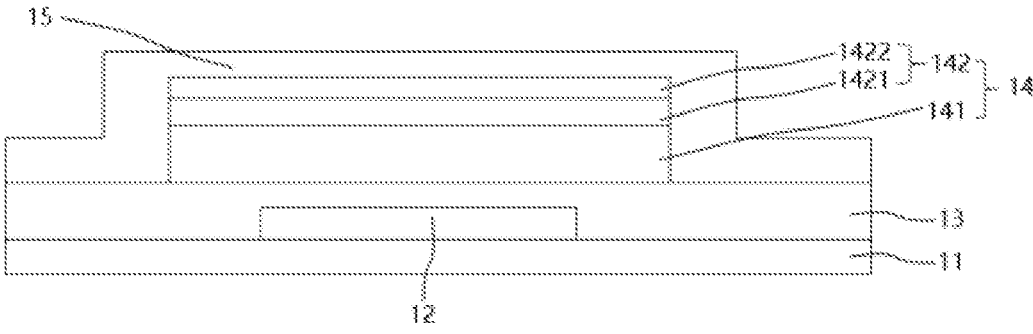
FIG. 5 is a schematic diagram of a third intermediate process of the manufacturing method of the display panel according to the embodiment of the present disclosure.
Figure 6:
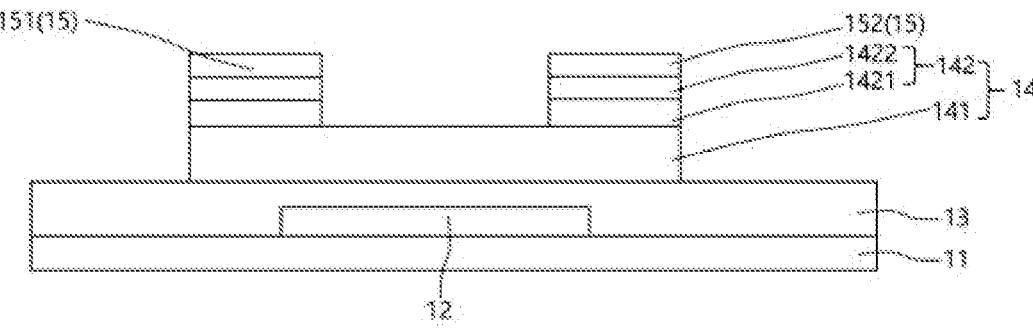
FIG. 6 is a schematic diagram of a fourth intermediate process of the manufacturing method of the display panel according to the embodiment of the present disclosure.

Referring to FIG. 2 to FIG. 6, FIG. 2 is a flowchart of a manufacturing method of a display panel according to an embodiment of the present disclosure, FIG. 3 is a schematic diagram of a first intermediate process of the manufacturing method of the display panel according to the embodiment of the present disclosure, FIG. 4 is a schematic diagram of a second intermediate process of the manufacturing method of the display panel according to the embodiment of the present disclosure, FIG. 5 is a schematic diagram of a third intermediate process of the manufacturing method of the display panel according to the embodiment of the present disclosure, and FIG. 6 is a schematic diagram of a fourth intermediate process of the manufacturing method of the display panel according to the embodiment of the present disclosure.

The manufacturing method of the display panel provided by the embodiment includes the step S100, the S200, the S300, and the S400.

At step S100, referring to FIG. 3, a substrate 11 is provided.

Furthermore, a gate 12 may be formed on the substrate 11, and a gate insulation layer 13 may be formed on the gate 12.

At step S200, referring to FIG. 4, a semiconductor layer 14 with a thickness greater than or equal to 640 Å and less than or equal to 1100 Å is formed on the gate insulation layer

13. Step S200 further includes following steps: forming a semiconductor sub-layer 141 on the gate insulation layer 13, forming a first sub-ohmic contact layer 1421 on the semiconductor sub-layer 141, and forming a second sub-ohmic contact layer 1422 on the first sub-ohmic contact layer 1421. A volume flow rate of phosphine for forming the first sub-ohmic contact layer is greater than or equal to 6590 sccm and less than or equal to 12590 sccm, and a volume flow rate of phosphine for forming the second sub-ohmic contact layer is greater than or equal to 21000 sccm and less than or equal to 27000 sccm. The first sub-ohmic contact layer 1421 and the second sub-ohmic contact layer 1422 form an ohmic contact layer 142 with a thickness greater than or equal to 40 Å and less than or equal to 100 Å.

Furthermore, as shown in FIG. 4, the semiconductor layer 14 formed on the gate insulation layer 13 is patterned. The display panel is provided with a plurality of thin film transistors, and a plurality of patterned semiconductor layers 14 can be formed on the gate insulation layer 13 and disposed in a same layer.

At step S300, referring to FIG. 5, a source/drain metal layer 15 is formed on the semiconductor layer 14.

At step S400, referring to FIG. 6, the source/drain metal layer 15 is etched by a wet etching process to form a source 151 and a drain 152. Then, the semiconductor layer 14 is etched by a dry etching process to remove a part of the ohmic contact layer 142 disposed between the source 151 and the drain 152. A volume flow rate of $Cl_2$ in etching gas for etching the semiconductor layer 14 is less than 400 sccm.

Specifically, when using the dry etching process to etch the semiconductor layer 14 to remove the part of the ohmic contact layer 142 disposed between the source 151 and the drain 152, the part of the ohmic contact layer 142 disposed between the source 151 and the drain 152 can be over-etched, that is, the part of the semiconductor sub-layer 141 disposed between the source 151 and the drain 152 can be partially etched off.

In this embodiment, etching time of the semiconductor layer 14 can be reduced by designing the thickness of the semiconductor layer 14 ranging from 640 Å to 1100 Å, thereby reducing a height of the abnormal protrusions. Moreover, by designing the ohmic contact layer 142 being formed by the first sub-ohmic contact layer 1421 and the second sub-ohmic contact layer 1422, and the volume flow rate of phosphine for forming the first sub-ohmic contact layer being greater than or equal to 6590 sccm and less than or equal to 12590 sccm, and the volume flow rate of phosphine for forming the second sub-ohmic contact layer being greater than or equal to 21000 sccm and less than or equal to 27000 sccm, a doping concentration of the first sub-ohmic contact layer 1421 can be less than a doping concentration of the second sub-ohmic contact layer 1422, in combination with the design of the thickness of the ohmic contact layer 142 ranging from 40 Å to 100 Å, film layer quality of the ohmic contact layer 142 can be adjusted to match the etching gas, which can reduce the height of the abnormal protrusions. Moreover, the design of the first sub-ohmic contact layer 1421 and the second sub-ohmic contact layer 1422 can reduce the contact resistance between the source 151 and the semiconductor layer 14, and the contact resistance between the drain 152 and the semiconductor layer 14. Furthermore, by designing the volume flow rate of $Cl_2$ in the etching gas for etching the semiconductor layer 14 being less than 400 sccm, the height of the abnormal protrusions can further be reduced, and even avoid the formation of the abnormal protrusions, thereby improving stability of the thin film transistors, and improving uniformity of the display panel.

At step S200, in some embodiments, a thickness of the first sub-ohmic contact layer 1421 is greater than a thickness of the second sub-ohmic contact layer 1422.

Specifically, due to a small thickness of the ohmic contact layer 142, the doping concentration of phosphine in the first sub-ohmic contact layer 1421 is less than the doping concentration of phosphine in the second sub-ohmic contact layer 1422, and the thickness of the first sub-ohmic contact layer 1421 is greater than the thickness of the second sub-ohmic contact layer 1422, so as to reduce the contact resistance between the source 151 and the semiconductor layer 14, and the contact resistance between the drain 152 and the semiconductor layer 14.

In some embodiments, at step S200, a volume flow rate of phosphine ($PH_3$) for forming the first sub-ohmic contact layer 1421 is greater than or equal to 6590 sccm and less than or equal to 12590 sccm, and a volume flow rate of $PH_3$ in etching gas for forming the second sub-ohmic contact layer 1422 is greater than or equal to 21000 sccm and less than or equal to 27000 sccm, so that the doping concentration of phosphine in the first sub-ohmic contact layer 1421 can be less than the doping concentration of phosphine in the second sub-ohmic contact layer 1422. Moreover, the above-mentioned design can also avoid the contact resistance between the source 151 and the semiconductor layer 14, and the contact resistance between the drain 152 and the semiconductor layer 14 being too large due to a less thickness of the ohmic contact layer 142.

In some embodiments, at step S400, the volume flow rate of $Cl_2$ in the etching gas for etching the semiconductor layer 14 may be equal to 0 sccm, which can avoid residue of the source/drain metal layer 15 after forming the source 151 and the drain 152, thereby avoiding the formation of the abnormal protrusions.

In some embodiments, materials of the source/drain metal layer 15 may include copper, which can reduce a width of a wiring formed by the source/drain metal layer 15, so as to reduce the resistance of the wiring, thereby improving the resolution of the display panel.

In some embodiments, the etching gas for etching the semiconductor layer 14 further includes sulfur hexafluoride ($SF_6$), so that the semiconductor layer 14 can be etched under an atmosphere including sulfur $SF_6$ and $Cl_2$, which can reduce the volume flow rate of $Cl_2$ in the etching gas for etching the semiconductor layer 14.

Figure 7:
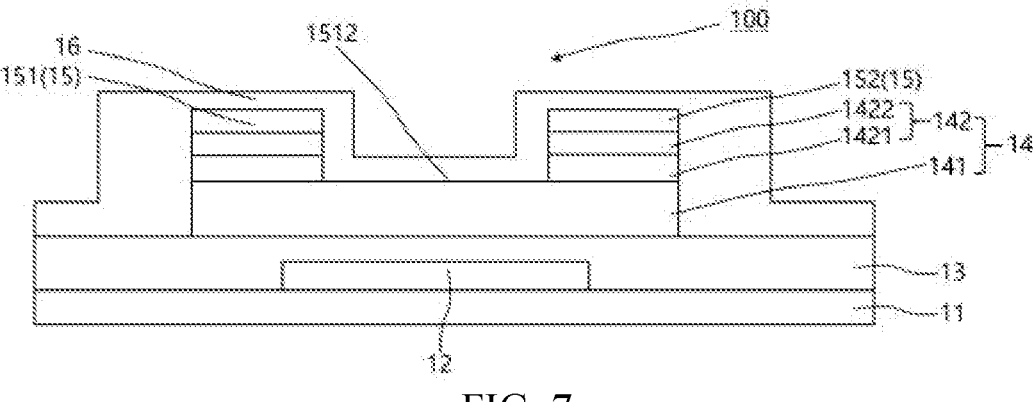
FIG. 7 is a schematic partial cross-sectional diagram of a display panel according to an embodiment of the present disclosure.

Referring to FIG. 7, FIG. 7 is a schematic partial cross-sectional diagram of a display panel according to an embodiment of the present disclosure. The embodiment of the present disclosure provides a display panel 100, and the display panel 100 includes a substrate 11 and a plurality of thin film transistors disposed on the substrate 11. Each of the thin film transistors includes a semiconductor layer 14. The semiconductor layer 14 includes a semiconductor sub-layer 141 and an ohmic contact layer 142 disposed on the semiconductor sub-layer 141. The ohmic contact layer 142 includes a first sub-ohmic contact layer 1421 disposed on the semiconductor sub-layer 141 and a second sub-ohmic contact layer 1422 disposed on the first sub-ohmic contact layer 1421. A doping concentration of the first sub-ohmic contact layer 1421 is less than a doping concentration of the second sub-ohmic contact layer 1422. A thickness of the ohmic contact layer 142 is greater than or equal to 40 Å and less than or equal to 100 Å.

It should be noted that FIG. 7 only illustrate a partial structure of the display panel 100, however, the display panel 100 may also include other structures. For example, FIG. 7 illustrates a partial structure of the array substrate, and the display panel may also include a color film substrate and a polarizer.

In some embodiments, a thickness of the first sub-ohmic contact layer 1421 is greater than a thickness of the second sub-ohmic contact layer 1422.

In some embodiments, the thin film transistor further includes a gate 12, a gate insulation layer 13, a source 151, and a drain 152. The gate 12 is disposed on the substrate 11. The gate insulation layer 13 is disposed on a surface of the gate 12 away from the substrate 11. The semiconductor layer 14 is disposed on a surface of the gate insulation layer 13 away from the substrate 11. The source 151 and the drain 152 are disposed on a surface of the ohmic contact layer 142 away from the substrate 11 at intervals. A part of the ohmic contact layer 142 disposed between the source 151 and the drain 152 is at least partially disconnected.

It should be noted that FIG. 7 illustrates that the thin film transistor is a bottom gate transistor. In other embodiments, the thin film transistor may be a top gate transistor.

Specifically, the part of the ohmic contact layer 142 disposed between the source 151 and the drain 152 is at least partially disconnected, that is, the part of the ohmic contact layer 142 disposed between the source 151 and the drain 152 is recessed towards a direction close to the substrate 11 or provided with an opening 1512, that is, the part of the ohmic contact layer 142 disposed between the source 151 and the drain 152 is at least partially etched off.

In some embodiments, the opening 1512 exposes the semiconductor sub-layer 141. Furthermore, in some embodiments, the opening 1512 passes through a part of the first sub-ohmic contact layer 1421 disposed between the source 151 and the drain 152, and a part of the second sub-ohmic contact layer 1422 disposed between the source 151 and the drain 152, and a width of the opening 1512 is equal to a distance between the source 151 and the drain 152.

In some embodiments, materials of the source/drain metal layer 15 may include copper, that is, both of materials of the source 151 and materials of the drain 152 include copper, which can reduce a width of a wiring including the source 151 and the drain 152, so as to reduce the resistance of the wiring, thereby improving the resolution of the display panel.

Specifically, a first insulation layer 16 disposed on the source 151 and the drain 152 is also illustrated in FIG. 7.

The display panel provided by the embodiment can be manufactured using the above-mentioned manufacturing method of the display panel. Therefore, structures and materials of the semiconductor layer 14, the source 151, and the drain 152 in this embodiment are the same or similar to those in the display panel manufactured using the above-mentioned manufacturing method, which will not be repeated here.

The present disclosure has been described in detail with respect to the manufacturing method of the display panel and the display panel according to the embodiments of the present disclosure. The principles and implementations of the present disclosure are described in detail here with specific examples. The above description of the embodiments is merely intended to help understand the method and core ideas of the present disclosure. At the same time, a person skilled in the art may make changes in the specific embodiments and disclosure scope according to the idea of the present disclosure. In conclusion, the content of the present specification should not be construed as a limitation to the present disclosure.

What is claimed is:

1. A manufacturing method of a display panel, comprising following steps:

providing a substrate;

forming a semiconductor layer on the substrate, wherein the step of forming the semiconductor layer on the substrate comprises: forming a semiconductor sub-layer on the substrate, forming a first sub-ohmic contact layer on the semiconductor sub-layer, and forming a second sub-ohmic contact layer on the first sub-ohmic contact layer; wherein a volume flow rate of phosphine for forming the first sub-ohmic contact layer is greater than or equal to 6590 sccm and less than or equal to 12590 sccm, and a volume flow rate of phosphine for forming the second sub-ohmic contact layer is greater than or equal to 21000 sccm and less than or equal to 27000 sccm; and wherein the first sub-ohmic contact layer and the second sub-ohmic contact layer form an ohmic contact layer with a thickness greater than or equal to 40 Å and less than or equal to 100 Å;

forming a source/drain metal layer on the semiconductor layer;

etching the source/drain metal layer to form a source and a drain, and etching the semiconductor layer to remove a part of the ohmic contact layer disposed between the source and the drain.

2. The manufacturing method of the display panel of claim 1, wherein a thickness of the first sub-ohmic contact layer is greater than a thickness of the second sub-ohmic contact layer.

3. The manufacturing method of the display panel of claim 1, wherein a doping concentration of the first sub-ohmic contact layer is less than a doping concentration of the second sub-ohmic contact layer.

4. The manufacturing method of the display panel of claim 1, wherein a volume flow rate of chlorine in an etching gas for etching the semiconductor layer is less than 400 sccm.

5. The manufacturing method of the display panel of claim 1, wherein materials of the source/drain metal layer comprise copper.

6. The manufacturing method of the display panel of claim 1, wherein a thickness of the semiconductor layer is greater than or equal to 640 Å and less than or equal to 1100 Å.

7. The manufacturing method of the display panel of claim 1, wherein the part of the ohmic contact layer disposed between the source and the drain is at least partially disconnected.

8. The manufacturing method of the display panel of claim 1, wherein the part of the ohmic contact layer disposed between the source and the drain forms an opening exposing the semiconductor sub-layer.

9. The manufacturing method of the display panel of claim 8, wherein the opening passes through a part of the first sub-ohmic contact layer and a part of the second sub-ohmic contact layer disposed between the source and the drain, and a width of the opening is equal to a distance between the source and the drain.

10. The manufacturing method of the display panel of claim 1, wherein a doping concentration of phosphine in the first sub-ohmic contact layer is less than a doping concentration of phosphine in the second sub-ohmic contact layer; and wherein a volume flow rate of chlorine in an etching gas for etching the semiconductor layer is less than 400 sccm.

11. The manufacturing method of the display panel of claim 1, wherein an etching gas for etching the semiconductor layer comprises chlorine and sulfur hexafluoride (SF6), and a volume flow rate of the chlorine is less than 400 sccm.

12. A manufacturing method of a display panel, comprising following steps:

providing a substrate;

forming a semiconductor layer on the substrate, wherein the step of forming the semiconductor layer on the substrate comprises: forming a semiconductor sub-layer on the substrate, forming a first sub-ohmic contact layer on the semiconductor sub-layer, and forming a second sub-ohmic contact layer on the first sub-ohmic contact layer; wherein a volume flow rate of phosphine for forming the first sub-ohmic contact layer is greater than or equal to 6590 sccm and less than or equal to 12590 sccm, and a volume flow rate of phosphine for forming the second sub-ohmic contact layer is greater than or equal to 21000 sccm and less than or equal to 27000 sccm; and wherein the first sub-ohmic contact layer and the second sub-ohmic contact layer form an ohmic contact layer with a thickness greater than or equal to 40 Å and less than or equal to 100 Å;

forming a source/drain metal layer on the semiconductor layer;

etching the source/drain metal layer to form a source and a drain, and etching the semiconductor layer to remove a part of the ohmic contact layer disposed between the source and the drain, wherein a volume flow rate of chlorine in an etching gas for etching the semiconductor layer is less than 400 sccm.

13. The manufacturing method of the display panel of claim 12, wherein the etching gas for etching the semiconductor layer further comprises sulfur hexafluoride (SF6).

* * * * *